(12) United States Patent
Byeon

(10) Patent No.: US 8,050,104 B2
(45) Date of Patent: Nov. 1, 2011

(54) NON-VOLATILE MEMORY DEVICE AND SYSTEM HAVING REDUCED BIT LINE BIAS TIME

(75) Inventor: Dae Seok Byeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 28 days.

(21) Appl. No.: 12/697,550

(22) Filed: Feb. 1, 2010

(65) Prior Publication Data

US 2010/0202216 A1    Aug. 12, 2010

(30) Foreign Application Priority Data

Feb. 6, 2009 (KR) .................. 10-2009-0009884

(51) Int. Cl.
*G11C 11/4193* (2006.01)

(52) U.S. Cl. .................................. 365/185.25; 365/203
(58) Field of Classification Search ............. 365/185.25, 365/203
See application file for complete search history.

(56) References Cited

U.S. PATENT DOCUMENTS

| 5,768,215 | A  | * | 6/1998  | Kwon et al. ............... 365/238.5 |
| 5,790,466 | A  |   | 8/1998  | Hotta |
| 6,490,199 | B2 |   | 12/2002 | Lee et al. |
| 2003/0112673 | A1 | * | 6/2003 | Takano et al. ................ 365/200 |
| 2007/0121376 | A1 | * | 5/2007 | Toda ........................... 365/185.2 |
| 2007/0165473 | A1 | * | 7/2007 | Suzuki et al. ................. 365/207 |

FOREIGN PATENT DOCUMENTS

| JP | 09147580 A | 6/1997 |
| JP | 2002237194 A | 8/2002 |
| KR | 100245244 B1 | 3/2000 |
| KR | 1020020064576 A | 8/2002 |
| KR | 1020050064666 A | 6/2005 |

* cited by examiner

*Primary Examiner* — Amir Zarabian
*Assistant Examiner* — Jay Radke
(74) *Attorney, Agent, or Firm* — Volentine & Whitt, PLLC

(57) ABSTRACT

A non-volatile memory device and system are provided. The non-volatile memory device including; a memory cell array of memory blocks, and a bit line bias block connected to the bit lines and configured to precharge the bit lines, a page buffer precharging the plurality of bit lines and sensing data stored in the memory block via the bit lines, and a controller controlling the bit line bias block to simultaneously precharge the bit lines with the page buffer, thereby reducing the bit line bias time.

11 Claims, 14 Drawing Sheets

NON-VOLATILE MEMORY DEVICE AND SYSTEM HAVING REDUCED BIT LINE BIAS TIME

CROSS-REFERENCE TO RELATED APPLICATIONS

This application claims priority under 35 U.S.C. §119 to Korean Patent Application No. 10-2009-0009884 filed on Feb. 6, 2009, the subject matter of which is hereby incorporated by reference.

BACKGROUND

The present inventive concept relates generally to semiconductor memory devices, and more particularly, to non-volatile memory devices having reduced bit line bias time.

Semiconductor memory devices include volatile semiconductor memory devices and non-volatile semiconductor memory devices. Volatile semiconductor memory devices are characterized by fast read/write speeds, but lose stored data in the absence of applied power. In contrast, non-volatile semiconductor memory devices have relatively slower read/write speeds, but are able to retain stored data in the absence of applied power. Thus, contemporary non-volatile semiconductor memory devices are commonly used in a variety of applications (e.g., portable electronic devices) benefiting from the secure retention of stored data even when power is interrupted, or only intermittently applied.

Nonvolatile semiconductor memory devices include phase-change random access memory (PRAM), mask read-only memory (MROM), programmable read-only memory (PROM), erasable programmable read-only memory (EPROM), and electrically erasable programmable read-only memory (EEPROM). The MROM, PROM, and EPROM among other types of nonvolatile semiconductor memory devices are difficult to program and erase using methods commonly accessible to the end user. On the other hand, EEPROM uses electrical program and erase operations readily controllable by the end user. As a result of this programming ease of use, the EEPROM has become a common data storage medium for both system programming data, as well as payload (or user) data. EEPROM finds application as a system memory or as an auxiliary memory.

Flash memory is one particularly useful form of EEPROM. Because of its high degree of integration, flash memory is very advantageous when used as a large-capacity auxiliary memory device. Accordingly, the flash memory is widely used in small electronic devices, such as the digital camera, digital camcorder, digital music player, etc., where data storage must be accomplished by circuitry having a compact size and competent reprogramming capabilities. Flash memory includes NAND-type flash memory and NOR-type flash memory.

Data is typically accessed in flash memory using a program operation, an erase operation, and a read operation. Before the read operation is executed, a precharge operation is performed. As part of the overall precharge operation, a bit line precharge operation is performed, wherein a bit line is biased by the application of electrical charge until the bit line reaches a predetermined precharge voltage.

Time required to precharge the bit line (hereafter referred to as the "bit line precharge time") is proportional to the resistance and the capacitance of the bit line. As the length of the bit line increases, its resistance and capacitance also increase. Accordingly, longer bit lines generally require a longer bit line precharge time. However, any increase in the bit line precharge time causes read operation performance (as measured e.g., in Megabytes (MB) per second) to deteriorate. Program operation performance is also adversely affected. Therefore, reducing the bit line bias time required by a non-volatile memory device increases overall performance.

SUMMARY

Embodiments of the inventive concept provide a non-volatile memory device having reduced bit line bias time and a memory system including the same.

According to an embodiment of the inventive concept, there is provided a non-volatile memory device including a memory cell array, a page buffer, and a controller. The memory cell array includes a plurality of memory blocks, each of which includes a plurality of memory cells, and at least one bit line bias block connected to a plurality of bit lines and precharging the bit lines.

The page buffer precharges the plurality of bit lines and senses data stored in the at least one memory block through the plurality of bit lines. The controller controls an operation of the non-volatile memory device and controls the at least one bit line bias block to precharge the plurality of bit lines together with the page buffer.

Each of the memory blocks may include a plurality of cell strings each connected to a corresponding one of the plurality of bit lines. The at least one bit line bias block may include a plurality of bias strings each connected to a corresponding one of the plurality of bit lines.

The plurality of bias strings may have the same structure as the plurality of cell strings but may be controlled to precharge the plurality of bit lines unlike the cell strings.

Each of the bias strings includes a string selection transistor having a gate connected to a string selection line and a drain connected to a corresponding one of the bit lines; a ground selection transistor having a gate connected to a ground selection line and a source connected to a power line; and a plurality of memory cell transistors connected in series between the string selection transistor and the ground selection transistor, a bit line power voltage for precharging the corresponding bit line is applied to the power line, and a precharge control voltage for transmitting the bit line power voltage to the corresponding bit line is applied to the string selection line, the ground selection line, and gates of the respective memory cell transistors.

Each of the cell strings includes a string selection transistor having a gate connected to a string selection line and a drain connected to a corresponding one of the bit lines; a ground selection transistor having a gate connected to a ground selection line and a source connected to a common source line; and a plurality of memory cell transistors connected in series between the string selection transistor and the ground selection transistor, and the controller applies a bit line power voltage for precharging a corresponding one of the plurality of bit lines to the common source line of at least one of the memory blocks and controls a precharge control voltage for transmitting the bit line power voltage to the corresponding bit line to be applied to the string selection line, the ground selection line, and gates of the respective memory cell transistors, thereby replacing the at least one memory block with the at least one bit line bias block.

The page buffer is disposed at a bottom of the memory cell array and the at least one bit line bias block is disposed at a top or middle of the memory cell array.

The at least one bit line bias block may include at least one bias transistor controlled by a bit line precharge control signal and having one terminal connected to a power line and another terminal connected to a corresponding one of the plurality of bit lines.

The at least one bit line bias block includes a plurality of power lines disposed orthogonal to the plurality of bit lines; a bias transistor disposed between the power lines; a first contact configured to connect one terminal of the bias transistor to one of the power lines; and a second contact configured to connect another terminal of the bias transistor to a corresponding one of the plurality of bit lines.

Each of the memory blocks includes a string selection line, a ground selection line, and a common source line which are disposed orthogonal to the plurality of bit lines; a string selection transistor having a gate connected to the string selection line and a drain connected to the corresponding one of the bit lines; a ground selection transistor having a gate connected to the ground selection line and a source connected to the common source line; and a plurality of memory cell transistors connected in series between the string selection transistor and the ground selection transistor; a third contact configured to connect the drain of the string selection transistor to the corresponding bit line; and a fourth contact configured to connect the source of the ground selection transistor to the common source line, the power lines and the common source line have the same layout, the bias transistor has the same layout as the string selection transistor or the ground selection transistor, and the first and second contacts have the same layout as the third and fourth contacts.

According to other embodiments of the present inventive concept, there is provided a memory system including the above-described non-volatile memory device; and a memory controller configured to control the non-volatile memory device.

BRIEF DESCRIPTION OF THE DRAWINGS

The above and other features and advantages of the present inventive concept will become more apparent by describing in detail embodiments thereof with reference to the attached drawings in which.

DETAILED DESCRIPTION OF THE EMBODIMENTS

Embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the drawings and written description, like reference numbers and labels are used to refer to like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
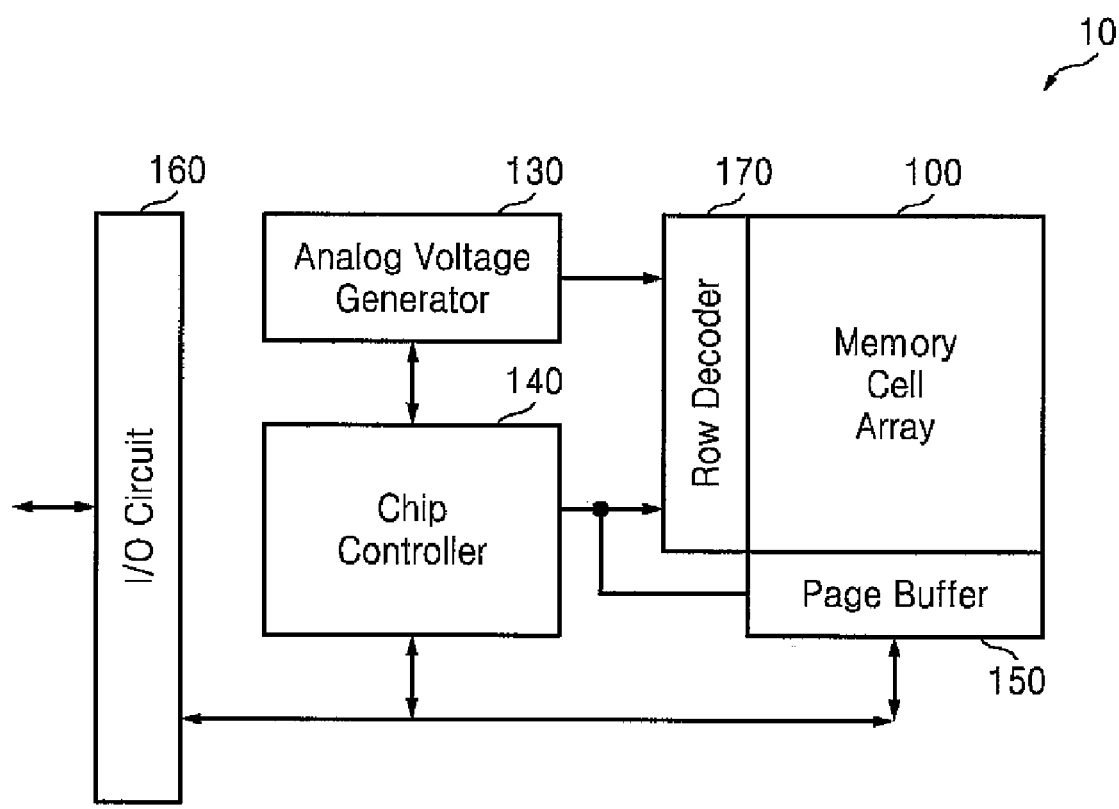
FIG. 1 is a block diagram of a non-volatile memory device according to an embodiment of the inventive concept.
Figure 2:
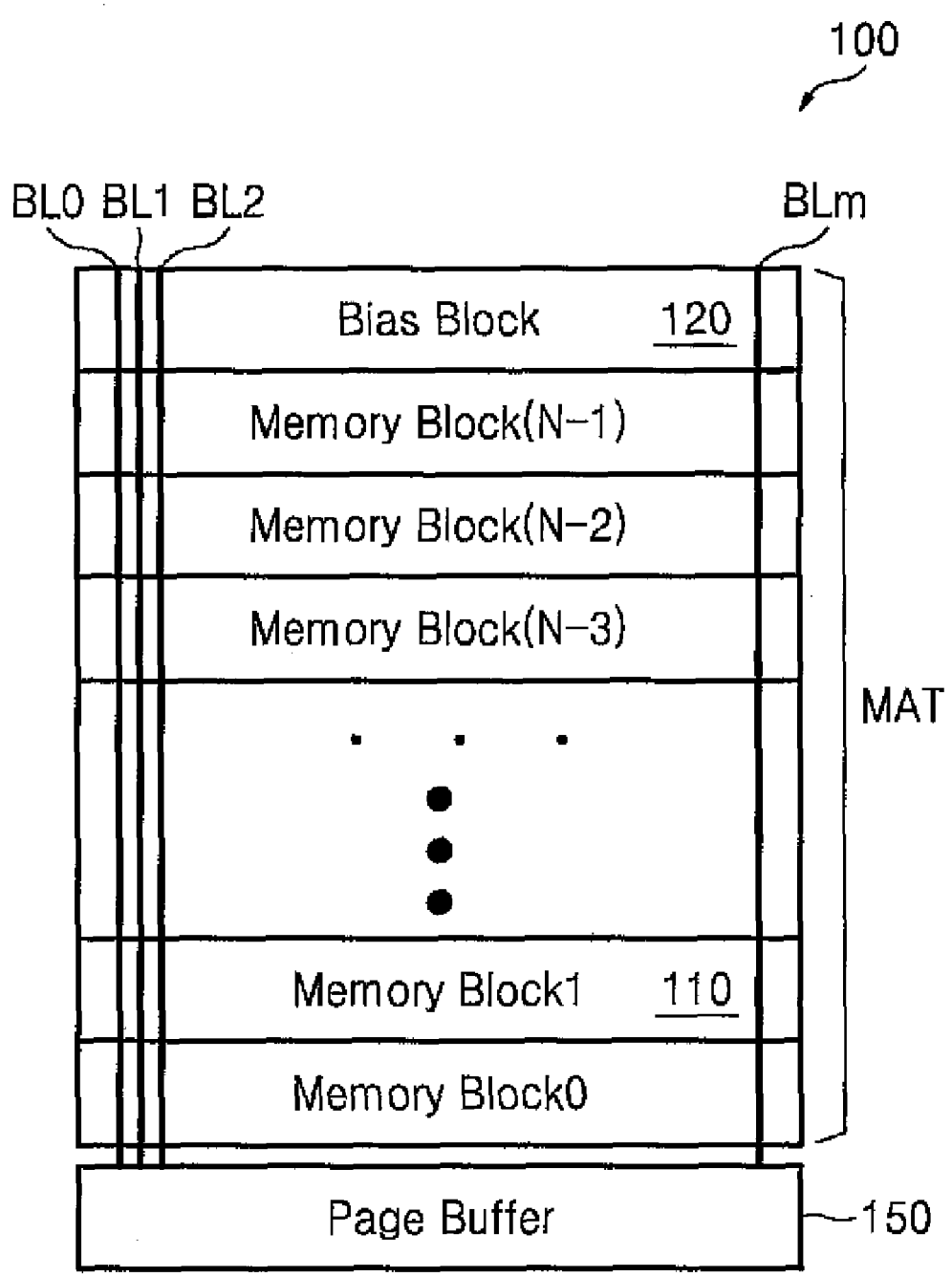
FIG. 2 is a block diagram of the structure of a memory cell array illustrated in FIG. 1 according to an embodiment of the inventive concept.
Figure 3A:
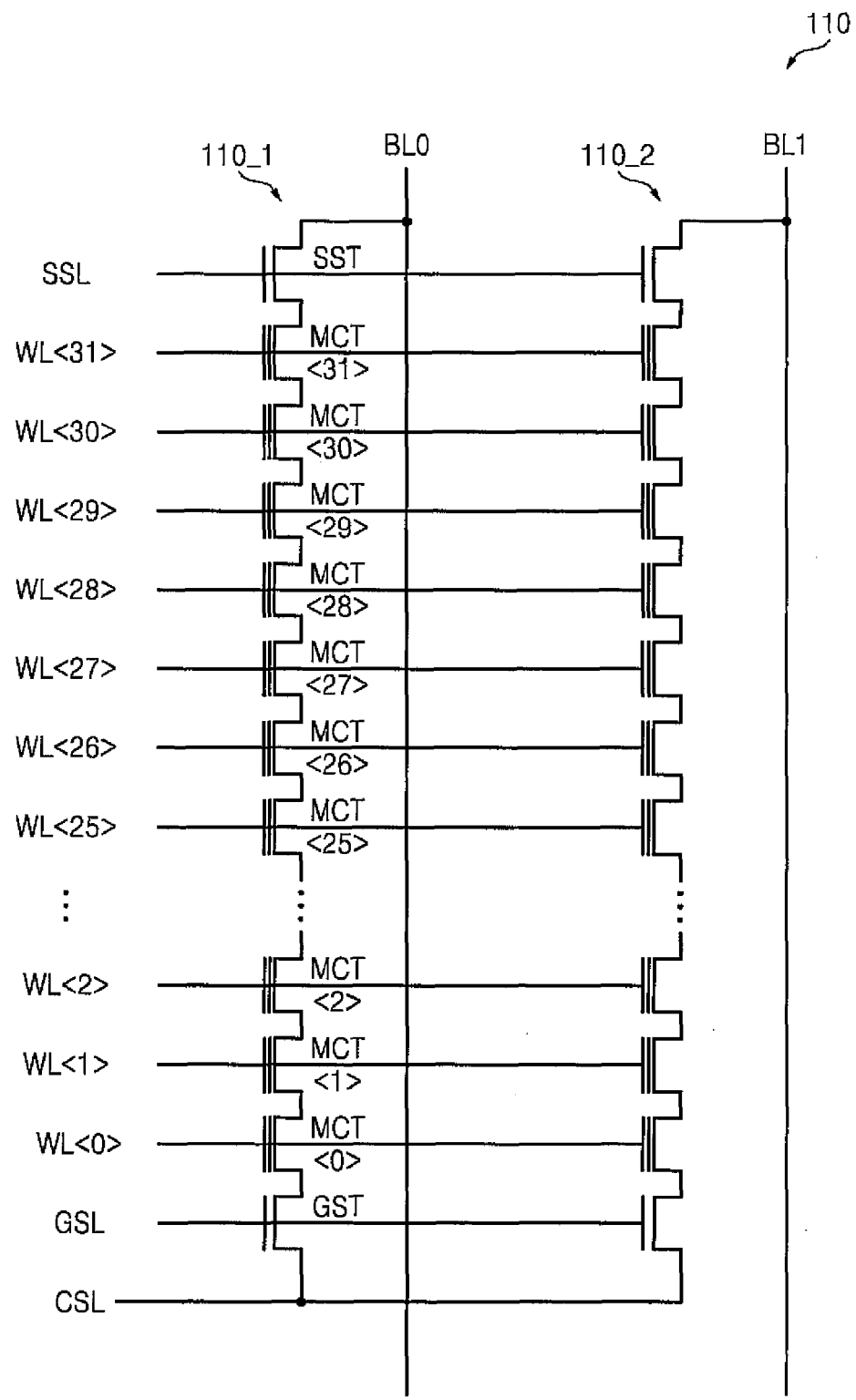
FIG. 3A is a circuit diagram of a memory block illustrated in FIG. 2.

FIG. 1 is a block diagram of a non-volatile memory device 10 according to an embodiment of the inventive concept. The example of FIG. 1 is drawn to a NAND-type flash memory device, but the inventive concept is not restricted thereto and can be applied to many types of non-volatile memory devices. FIG. 2 is a block diagram of the structure of a memory cell array 100 illustrated in FIG. 1 according to an embodiment of the present inventive concept. FIG. 3A is a circuit diagram of a memory block 110 illustrated in FIG. 2.

Referring to FIGS. 1, 2 and 3A, the memory device 10 comprises the memory cell array 100, a row decoder 170, a voltage generator 130, a chip controller 140, a page buffer circuit 150, and an input/output (I/O) circuit 160.

The memory cell array 100 may include at least one memory "MAT". The memory MAT may include a plurality of memory blocks 0 through (N−1) and at least one bit line bias block 120, as illustrated in FIG. 2. Each of the memory blocks 0 through (N−1) includes a plurality of cell strings 110_1 and 110_2 extending along a column, as illustrated in FIG. 3A. For clarity of the description, only one memory block 110 and two cell strings 110_1 and 110_2 are illustrated in FIG. 3A.

Each of the strings 110_1 through 110_2 includes a string selection transistor SST, a ground selection transistor GST, and a plurality of memory cell transistors MCT<0> through MCT<31> connected in series between the string selection transistor SST and the ground selection transistor GST. A gate of the string selection transistor SST is connected to a string selection line SSL and a drain thereof is connected to a corresponding bit line among a plurality of bit lines BL0 through BLm. A gate of the ground selection transistor GST is connected to a ground selection line GSL and a source thereof is connected to a common source line CSL. Control gates of the respective memory cell transistors MCT<0> through MCT<31> are respectively connected to word lines WL<0> through WL<31>.

The voltage level of the lines SSL, WL<0> through WL<31>, and GSL is controlled by the row decoder 130 in response to a predetermined timing control signal (not shown) and the voltage level of each of the bit lines BL0 through BLm is controlled by a page buffer (not shown) included in the page buffer circuit 150. Here, an operation of controlling the lines SSL, WL<0> through WL<31>, and GSL and an operation of controlling the bit lines BL0 through BLm are obvious to those of ordinary skill in the art, and a detailed description thereof will be thus omitted. Each of the memory cell transistors MCT<0> through MCT<31> in the memory cell array 110 is a multi-level cell storing data of multiple bits, i.e., at least two bits.

In the embodiments illustrated in FIG. 3A, each of the cell strings 110_1 and 110_2 includes 32 memory cell transistors MCT<0> through MCT<31>, but the number of cell transistors included in a single cell string may be changed.

The page buffer circuit 150 is selectively connected to a plurality of bit lines BL0 through BLm and writes (or programs) data to certain memory cells or reads data from certain memory cells by sensing and amplifying the data.

The row decoder 170 selects one word line from among a plurality of word lines WL<0> through WL<31> in response to a row address and applies a first operating voltage to the selected word line and a second operating voltage to non-selected word lines. For instance, during a program operation, the row decoder 170 may apply the first operating voltage (e.g., a program voltage) to a selected word line and the second operating voltage (e.g., a pass voltage) to non-selected word lines. The program voltage may be 15 to 20 V and the pass voltage may be 10 V. During a read operation, the row decoder 170 may apply the first operating voltage (e.g., a ground voltage) to a selected word line and the second operating voltage (e.g., a read voltage) to non-selected word lines. The read voltage may be 4.5 V. The program voltage is generally higher than the pass voltage. The pass voltage is generally higher than the read voltage.

The voltage generator 130 generates a voltage (e.g., the program voltage, the pass voltage, or the read voltage) necessary for the operation of the memory device 10.

The chip controller 140 outputs an internal control signal (not shown) for controlling the operation (e.g., the program operation, the erase operation, or the read operation) of the memory device 10 in response to an externally input command.

The I/O circuit 160 provides an interface with an external data source/destination (e.g., a memory controller or a host). The I/O circuit 160 receives a command and data to be programmed from the external device and transmits a state signal and read data to the external device.

Figure 3B:
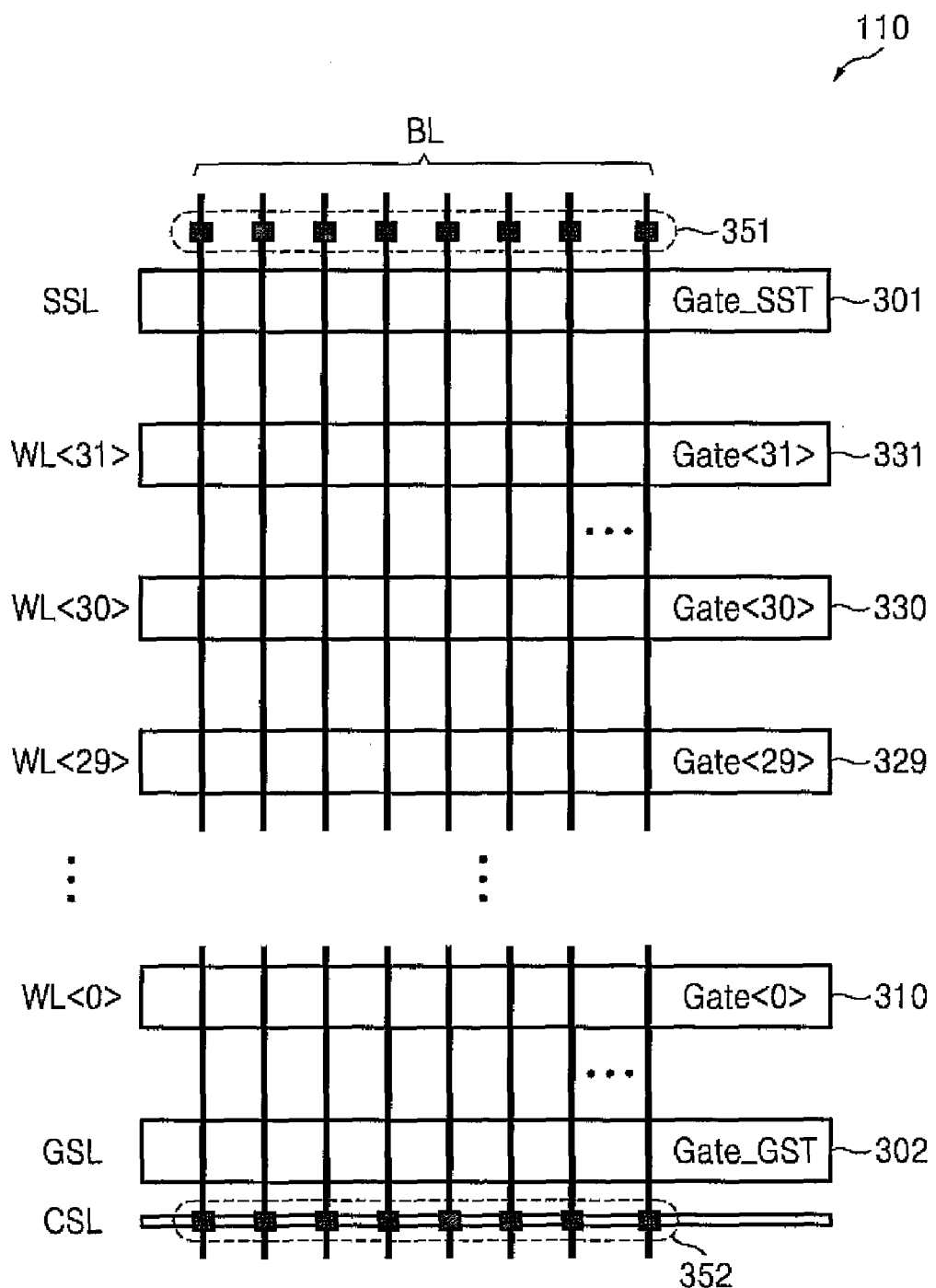
FIG. 3B is a schematic layout of the memory block illustrated in FIG. 3A.

FIG. 3B is a schematic layout of the memory block 110 illustrated in FIG. 3A. Referring to FIG. 3B, a common source line CSL is disposed orthogonal to a plurality of bit lines BL. String selection transistors SST are arranged in a region 301. Ground selection transistors GST are arranged in a region 302. A plurality of memory cell transistors MCT<0> through MCT<31> are spread over regions 310 through 331 between the string selection transistors SST and the ground selection transistors GST.

In addition, a plurality of contacts 351 are provided to respectively connect drains of the string selection transistors SST to the bit lines BL, respectively, and a plurality of contacts 352 are provided to respectively connect sources of the ground selection transistors GST to the common source line CSL. Although not shown in FIG. 3B, contacts for respectively connecting row lines, i.e., a string selection line SSL, the word lines WL<0> through WL<31>, and a ground selection line GSL to gates Gate_SST, Gate<0> through Gate<31>, and Gate_GST may also be provided. The row lines SSL, WL<0> through WL<31>, and GSL may be disposed orthogonal to the bit lines BL.

Figure 4A:
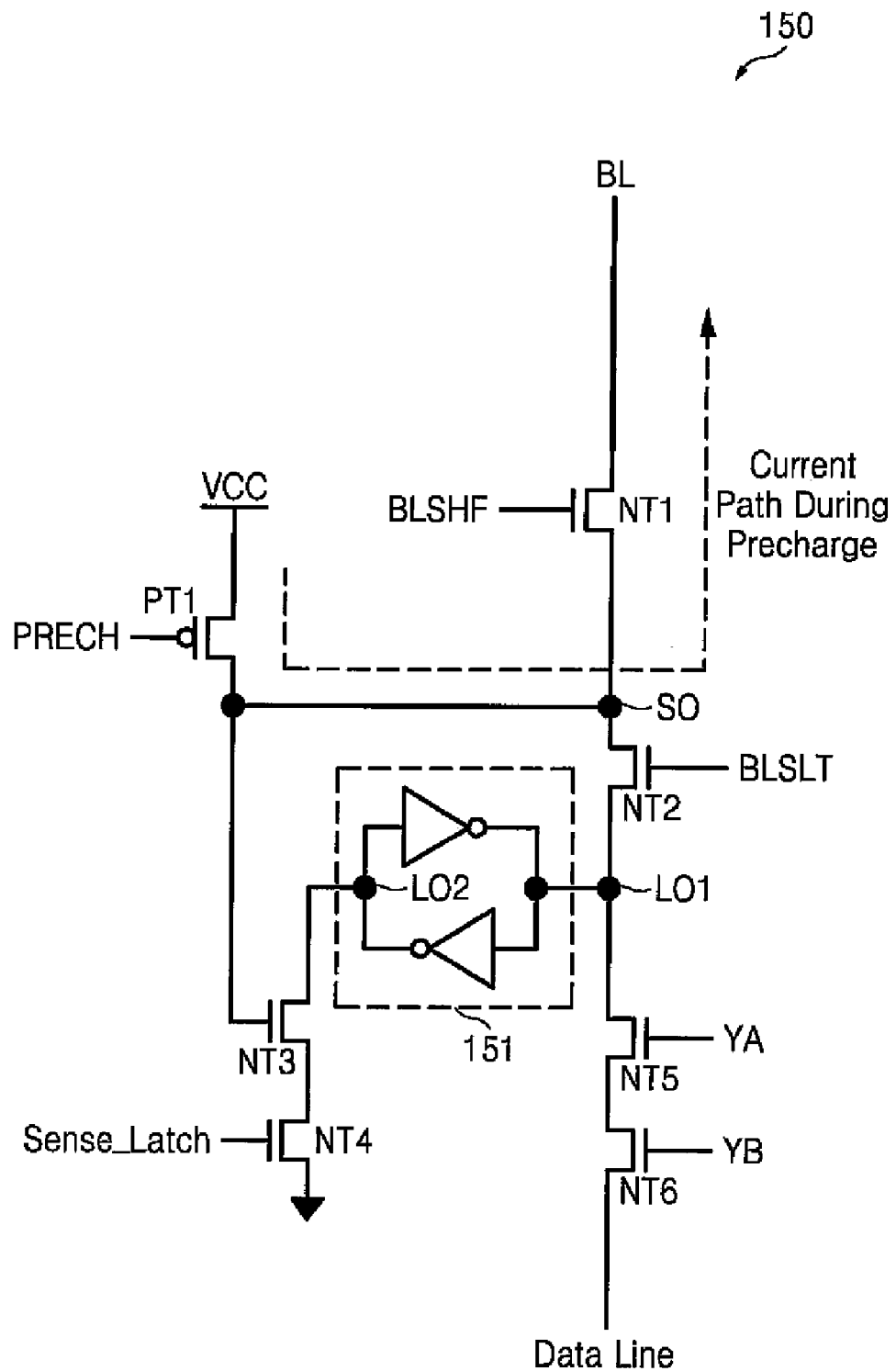
FIG. 4A is a circuit diagram of a relevant portion of a page buffer circuit illustrated in FIG. 1.
Figure 4B:
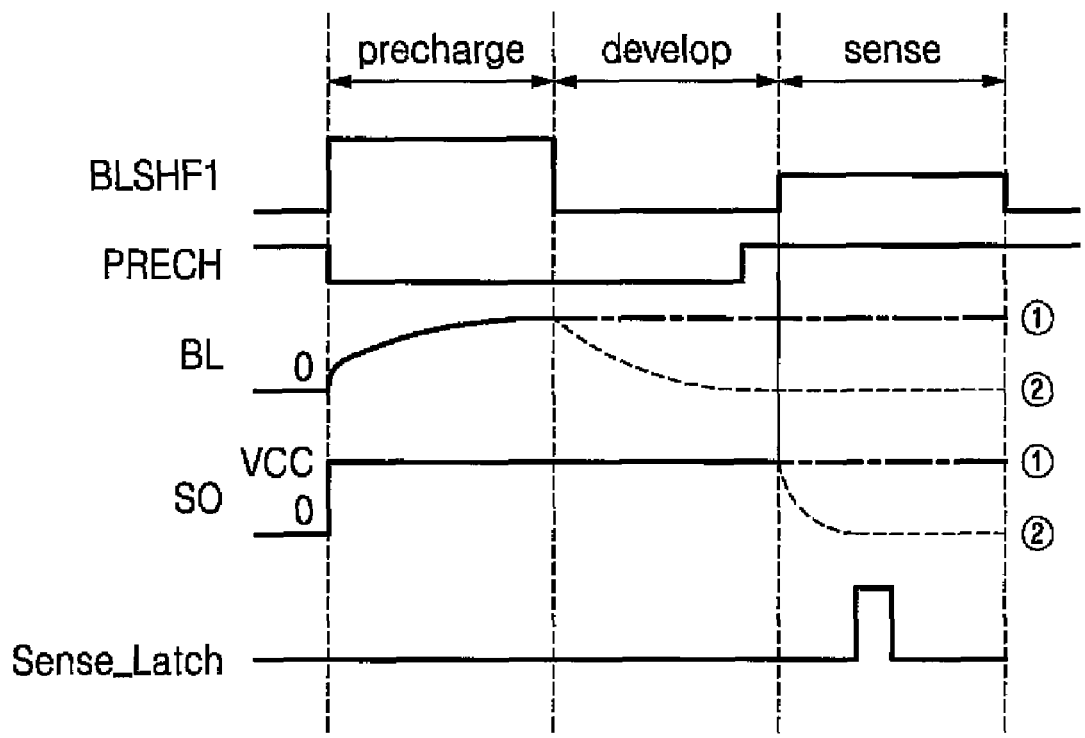
FIG. 4B is a timing chart further illustrating a data read operation according to an embodiment of the inventive concept.

FIG. 4A is a circuit diagram of a relevant portion of the page buffer circuit 150 illustrated in FIG. 1, and FIG. 4B is a related timing chart further illustrating a data read operation according to an embodiment of the inventive concept. The page buffer circuit 150 may include a plurality of page buffers each connected to a bit line. Although only one page buffer 150 connected to a single bit line BL is illustrated in FIG. 4A, as many page buffers 150 as there are bit lines may be provided within embodiments of the inventive concept.

The page buffer 150 includes first through sixth NMOS transistors NT1 through NT6, a PMOS transistor PT1, and a latch 151. The first NMOS transistor NT1 is connected between the bit line BL and a node SO and operates in response to a first bit line control signal BLSHF1. The second NMOS transistor NT2 is connected between the node SO and a first node LO1 of the latch 151 and operates in response to a bit line selection signal BLSLT. The first PMOS transistor PT1 is connected between a first power supply VCC and the node SO and operates in response to a precharge signal PRECH. The third and fourth NMOS transistors NT3 and NT4 are connected in series between a second node LO2 of the latch 151 and a second power supply GND and operate in response to a signal of the node SO and a latch signal Sense_Latch, respectively. The fifth and sixth NMOS transistors NT5 and NT6 is connected in series between the first node LO1 and a data line and operate in response to column selection signals YA and YB, respectively.

Referring to FIG. 4B, the data read operation generally comprises a bit line precharge operation, a data development operation, and a data sensing operation. In the bit line precharge operation, the first bit line control signal BLSHF1 and the precharge signal PRECH are activated to a high level and a low level, respectively, and the first NMOS transistor NT1 and the first PMOS transistor PT1 are thus turned ON. As a result, a current path is formed from the first power supply VCC to the bit line BL, and therefore, the bit line BL is precharged to a predetermined precharge voltage.

In the data development state, the first bit line control signal BLSHF1 is deactivated and the first NMOS transistor NT1 is thus turned OFF. Accordingly, the voltage level of the bit line BL varies with data of a memory cell. In detail, the bit line BL is maintained at the precharge voltage (①) or decreased (②) depending on the data of the memory cell.

In the data sensing state, the precharge signal PRECH is deactivated and the first PMOS transistor PT1 is thus turned OFF. Meanwhile, the first and second NMOS transistors NT1 and NT2 are turned ON in response to the first bit line control signal BLSHF1 and the bit line selection signal BLSLT, respectively, and the voltage level of the bit line BL is thus reflected to the node SO and the first node LO1 of the latch 151. At this time, the latch signal Sense_Latch is activated for a predetermined period of time and a latch operation is thus performed.

When the voltage of the bit line BL is close to the precharge voltage (①), the second node LO2 of the latch 151 becomes to be at a low level by the operation of the third and fourth NMOS transistors NT3 and NT4, and therefore, the first node LO1 of the latch 151 becomes to be at a high level. When the voltage of the bit line BL is decreased below the precharge voltage (②), the first node LO1 of the latch 151 becomes to be at the low level. Data latched by the latch 151, i.e., data at the first node LO1 of the latch 151 is transmitted to the data line when the column selection signals YA and YB are activated.

Figure 5A:
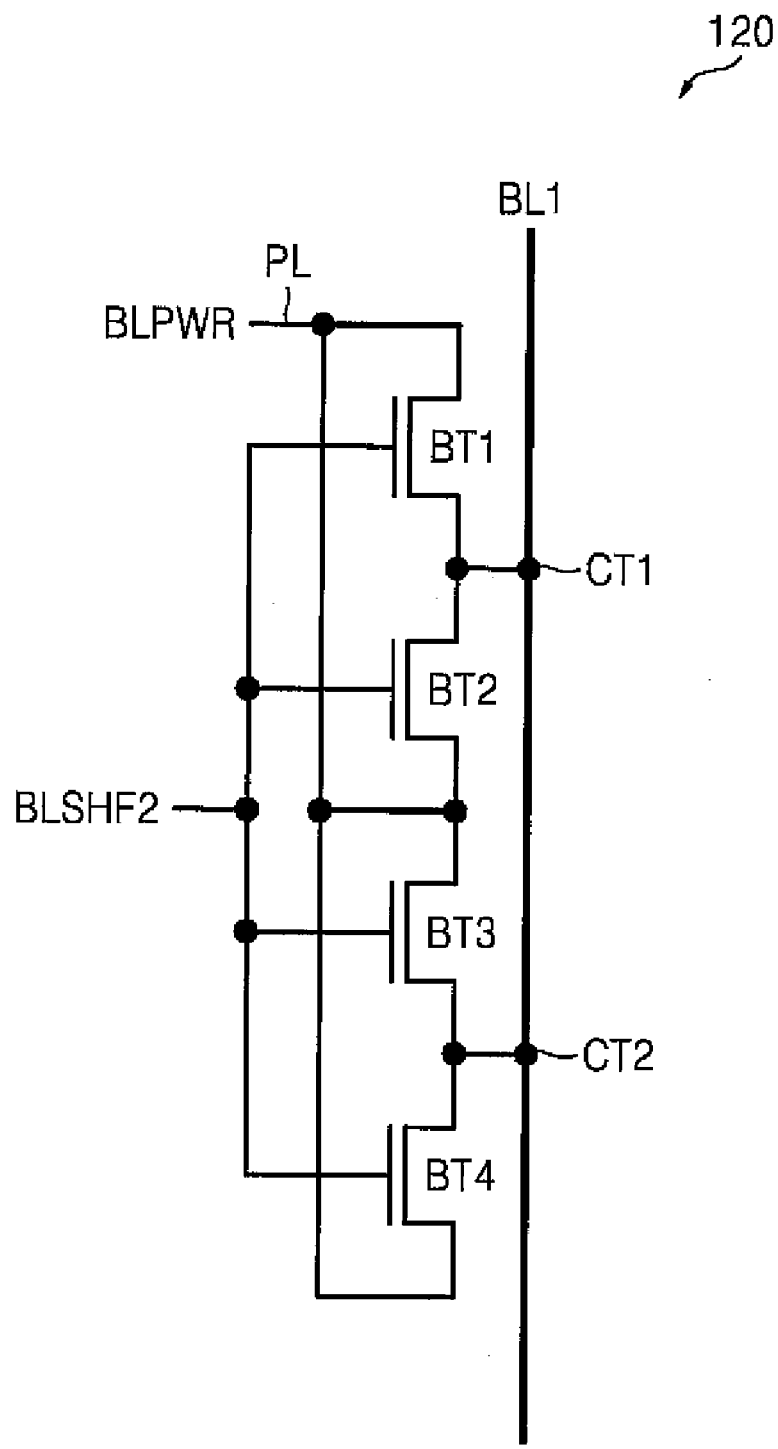
FIGS. 5A and 5B are a circuit diagram and a layout of a part of a bit line bias block illustrated in FIG. 2.
Figure 5B:
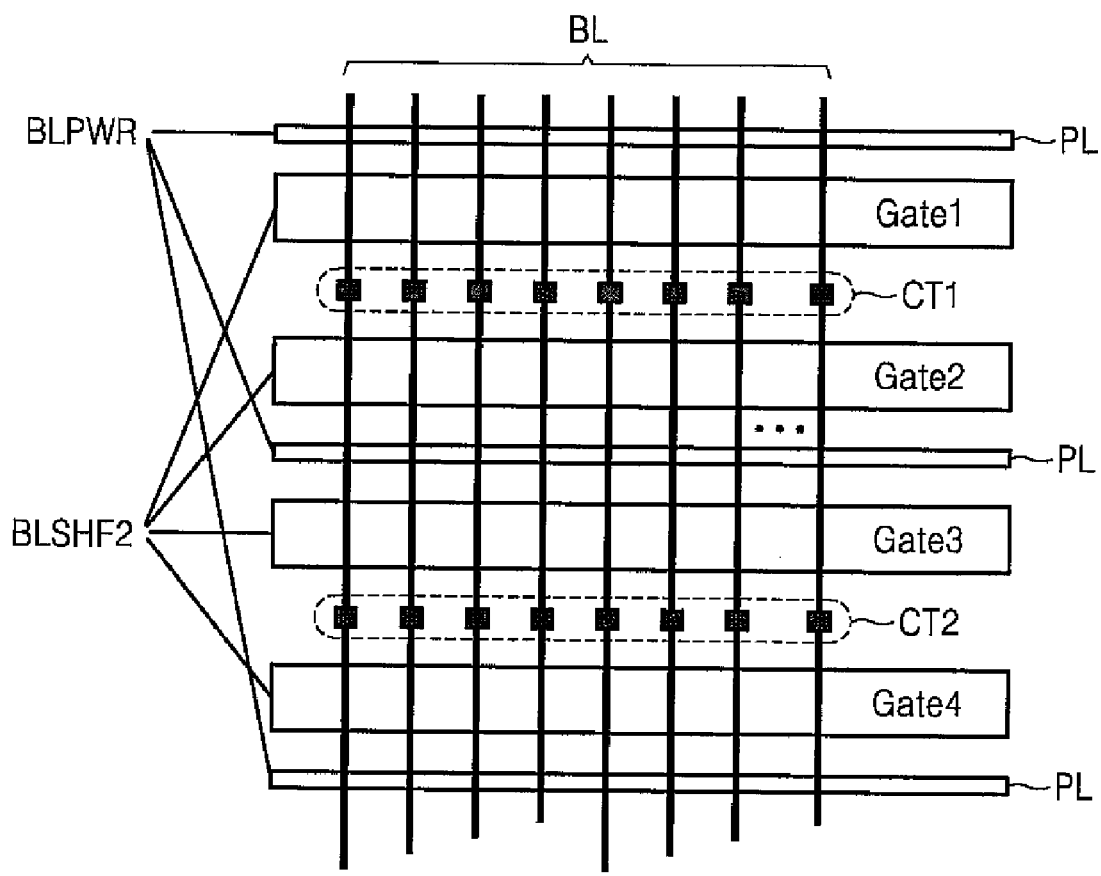

FIGS. 5A and 5B are a circuit diagram and a layout of a part of the bit line bias block 120 illustrated in FIG. 2. Although only a circuit connected to a single bit line BL1 is illustrated in FIG. 5A, the circuit illustrated in FIG. 5A may be provided for each one of a plurality of bit lines BL within embodiments of the inventive concept.

Referring to FIG. 5A, the bit line bias block 120 includes first through fourth bias transistors BT1 through BT4. The first through fourth bias transistors BT1 through BT4 are implemented using NMOS transistors in the illustrated embodiments, but the inventive concept is not restricted to only this particular implementation option. For example, the first through fourth bias transistors BT1 through BT4 may be implemented by PMOS transistors or depletion transistors.

The first through fourth bias transistors BT1 through BT4 are series connected one to another. The drains of the first through fourth bias transistors BT1 through BT4 are connected to a power line PL and the sources are connected to the bit line BL1 through a contact CT1 or CT2. A second bit line control signal BLSHF2 is commonly applied to the gates of the first through fourth bias transistors BT1 through BT4.

Like the first bit line control signal BLSHF1, the second bit line control signal BLSHF2 is activated to a predetermined logic level (e.g., a logically "high" level) in the bit line precharge operation and is deactivated when the bit line precharge operation ends. When the second bit line control signal BLSHF2 is activated, the first through fourth bias transistors BT1 through BT4 are all turned ON. As a result, bit line power voltage BLPWR is transmitted to the bit line BL1 through the power line PL and the first through fourth bias transistors BT1 through BT4, so that bit line precharge is accomplished.

As described above, according to the illustrated embodiment of the inventive concept, bit line precharge may be performed simultaneously by the page buffer circuit 150 at the bottom of the MAT and the bit line bias block 120 at the top of the MAT. As a result, a bit line precharge time is reduced.

Referring to FIG. 5B, the bit line bias block 120 includes a plurality of bit lines BL, a plurality of power lines PL disposed orthogonal to the bit lines BL, first through fourth gates Gate1 through Gate4, and a plurality of contacts CT1 and CT2. The bit line power voltage BLPWR is applied to the power lines PL. First through fourth bias transistors BT1 through BT4 are formed below and around the first through fourth gates Gate1 through Gate4.

Referring to FIGS. 3B and 5B, the layout of the bit line bias block 120 is similar to that of the memory block 110. For instance, the layout of the first through fourth bias transistors BT1 through BT4 is the same as that of the string selection transistors SST and the ground selection transistors GST in the memory block 110. The contacts CT1 and CT2 for connecting the sources of the first through fourth bias transistors BT1 through BT4 to the bit lines BL are also the same as the contacts 351 for connecting the drains of the string selection transistors SST to the bit lines BL and the contacts 352 for connecting the sources of the ground selection transistors GST to the common source line CSL. In addition, the layout of the power lines PL is similar to that of the common source line CSL. Accordingly, processes and geometry applied to the memory block 110 may also be applied to the bit line bias block 120.

Consequently, the bit line bias block 120 can be implemented within the memory cell array 100 in similar manner to the implementation of the memory block 110. When the bit line bias block 120 is implemented outside the memory cell array 100, the increase of size and area is unavoidable because photo condition is changed. However, when the bit line bias block 120 is implemented within the memory cell array 100, such disadvantages can be eliminated.

The bit line bias block 120 is disposed at the top of the MAT in an embodiment of the present inventive concept, but the present inventive concept is not restricted thereto. In other embodiments, the bit line bias block 120 may be disposed at the middle or multiple portions of the MAT, thereby more reducing the bit line precharge time.

Figure 6:
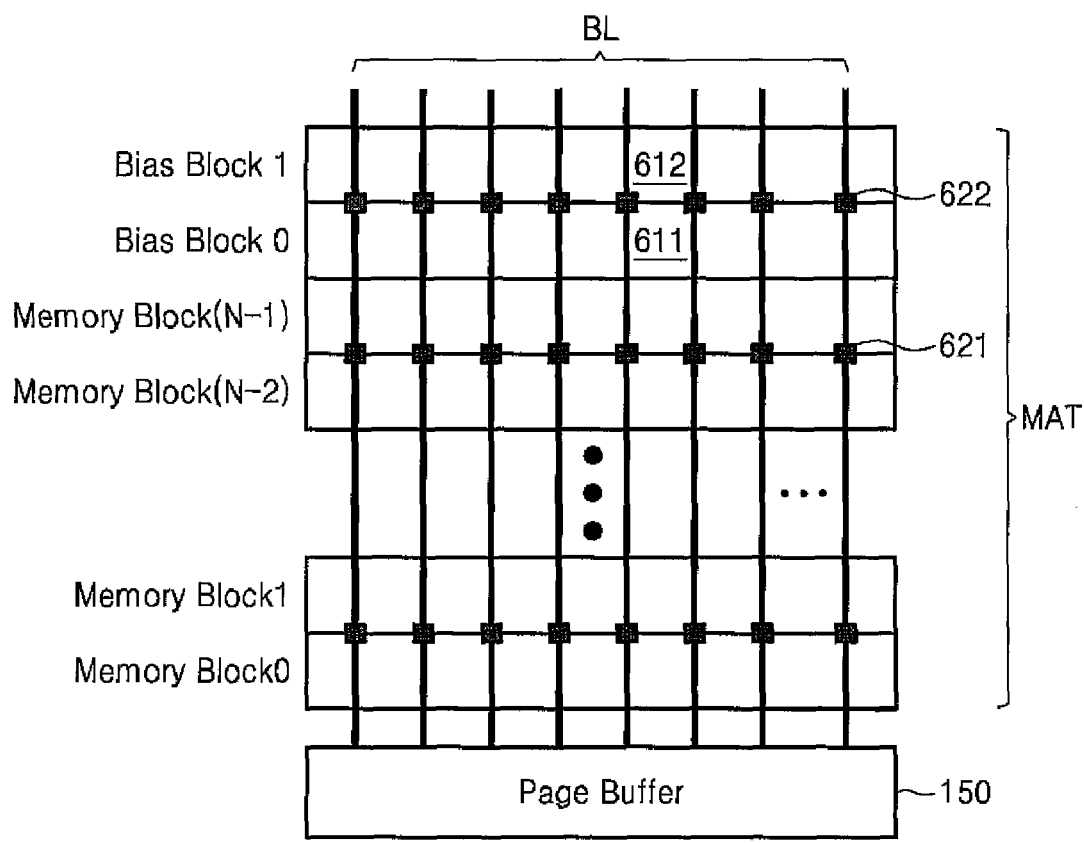
FIG. 6 is a block diagram of the structure of the memory cell array of FIG. 1 according to an embodiment of the inventive concept.

FIG. 6 is a block diagram further illustrating one possible structure for the memory cell array 100 of FIG. 1 according to another embodiment of the inventive concept. In the illustrated example of FIG. 6, the memory cell array 100 includes at least one memory MAT. The memory MAT includes a plurality of memory blocks 0 through (N−1) and one or more bit line bias blocks, e.g., a first bit line bias block 611 and a second bit line bias block 612. The memory blocks 0 through (N−1) illustrated in FIG. 6 have the same structure and functions as the memory blocks 0 through (N−1) illustrated in FIGS. 3A and 3B. Thus, detailed descriptions thereof are omitted.

Figure 7:
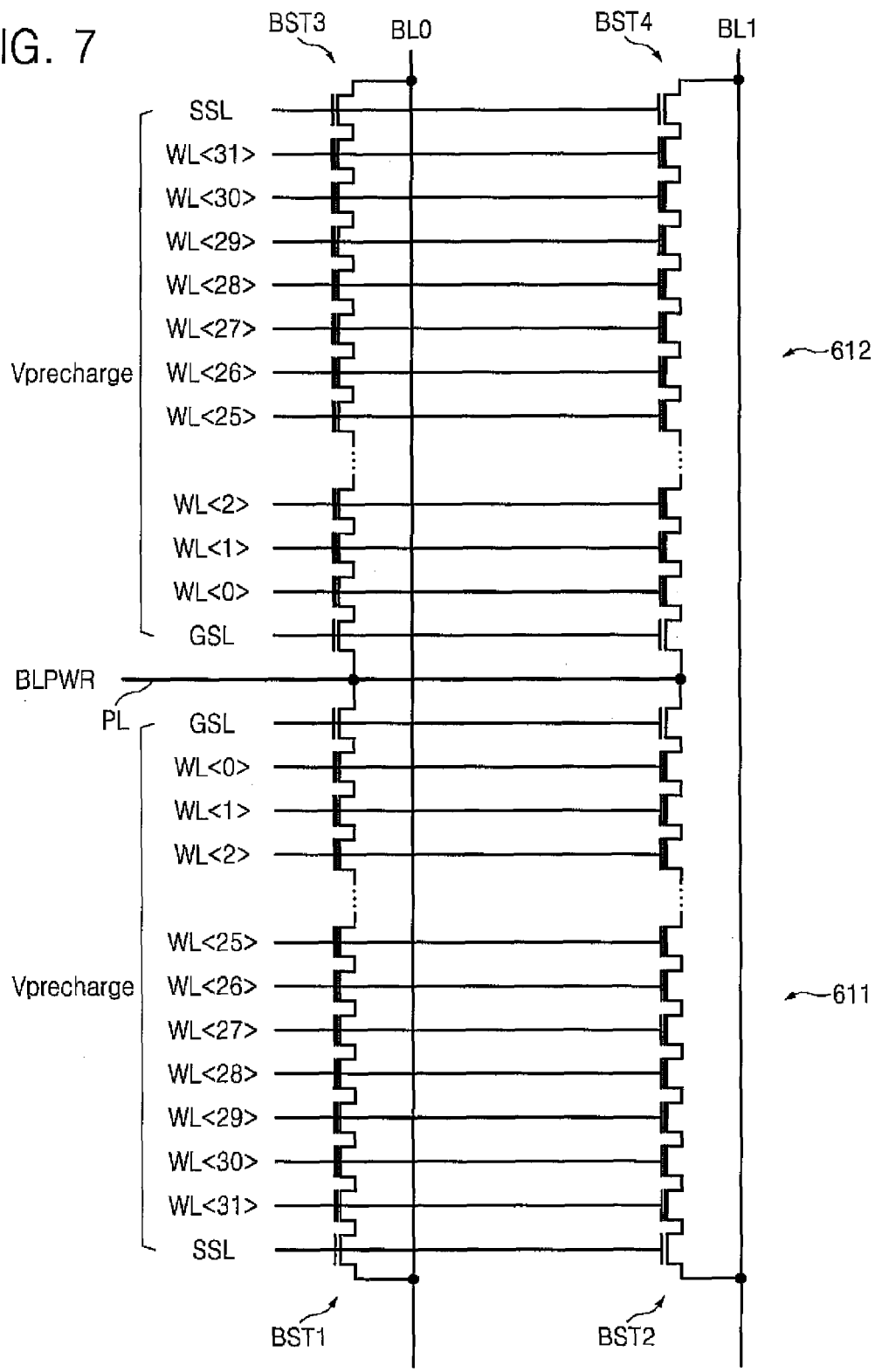
FIG. 7 is a circuit diagram of the bias blocks illustrated in FIG. 6.

FIG. 7 is a circuit diagram of the bit line bias blocks 611 and 612 illustrated in FIG. 6. The first bit line bias block 611 includes a plurality of bias strings BST1 and BST2 respectively connected to a plurality of bit lines BL0 and BL1 and the second bit line bias block 612 includes a plurality of bias strings BST3 and BST4 respectively connected to the lines BL0 and BL1. In this context, the terms "bias string" refers to a string arrangement of cells respectively connected to a bit line in a bit line bias block, such as bit line bias blocks 611 and 612 shown in FIG. 7. The bit lines BL0 and BL1 are precharged through the bias strings BST1 through BST4. Although only the bias strings BST1 through BST4 connected to the two bit lines BL0 and BL1 are illustrated in FIG. 7, the same structure is applied throughout the other bit lines BL2 through BLm in FIG. 2.

Each of the bias strings BST1 through BST4 has the same structure as the cell string 110_1 or 110_2 illustrated in FIG.

3A but is controlled in a different way to precharge the bit line BL0 or BL1. In particular, the second bit line bias block 612 is the same as the memory block 110 illustrated in FIG. 3A, with the exception that it includes a power line PL instead of common source line CSL to provide bit line power voltage BLPWR.

The structure of the first bit line bias block 611 and the structure of the second bit line bias block 612 are symmetric with respect to the power line PL. Accordingly, the first and second bit line bias blocks 611 and 612 have the same structure and layout as the memory block 110 but operate differently from the memory block 110.

The power line PL used to provide the bit line power voltage BLPWR is shared by the first and second bit line bias blocks 611 and 612. In FIG. 6, reference numeral 622 denotes a contact point between the power line PL and each of the bias strings BST1 through BST4 and reference numeral 621 denotes a contact point between the common source line CSL and each cell string.

The power line PL of the first and second bit line bias blocks 611 and 612 is electrically separated from the common source line CSL of the memory block 110 and is controlled independently thereof. Also, row lines SSL, WL<0> through WL<31>, and GSL of the first and second bit line bias blocks 611 and 612 are controlled differently from the row lines SSL, WL<0> through WL<31>, and GSL of the memory block 110.

Like the bit line bias block 120, the first and second bit line bias blocks 611 and 612 precharge the bit lines BL0 and BL1 by providing the bit line power voltage BLPWR to the bit lines BL0 and BL1 in the bit line precharge operation. For this operation, the bit line power voltage BLPWR may be applied to the power line PL of the first and second bit line bias blocks 611 and 612 and a precharge control voltage Vprecharge for enabling the bit line power voltage BLPWR to be efficiently transmitted to the bit lines BL0 and BL1 may be applied to the row lines SSL, WL<0> through WL<31>, and GSL. An appropriate precharge control voltage Vprecharge may be determined through simulation, modeling, or experimentation.

As described above, according to an embodiment of the inventive concept, at least one block among the memory blocks 0 through (N−1) may be designated as a bit line bias block and a bit line may be biased through a bias string of the bit line bias block. In other words, at least one of the memory blocks 0 through (N−1) may be replaced with a bit line bias block for biasing a bit line. Accordingly, in the bit line precharge operation, a bit line is precharged simultaneously by the page buffer circuit 150 and the bit line bias blocks 611 and 612 selected from the memory blocks 0 through (N−1), so that the bit line precharge time is reduced.

Figure 8:
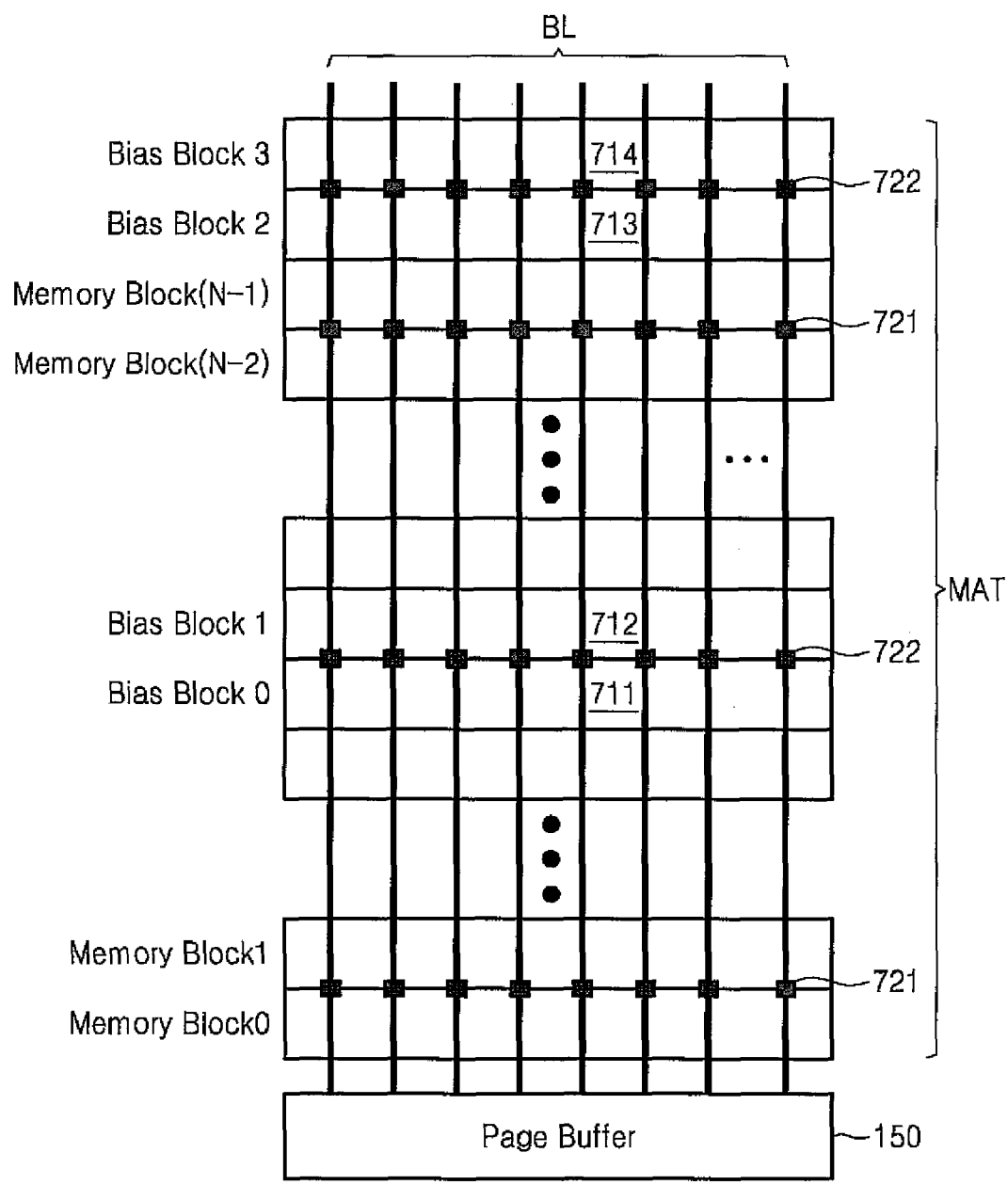
FIG. 8 is a block diagram of the structure of the memory cell array of FIG. 1 according to another embodiment of the inventive concept.

FIG. 8 is a block diagram further illustrating another possible structure for the memory cell array 100 of FIG. 1 according to another embodiment of the inventive concept. In the illustrated example of FIG. 8, a plurality of bit line bias blocks 711 through 714 are disposed at a plurality of portions of the memory MAT. In detail, the two bit line bias blocks 713 and 714 are disposed at the top of the memory MAT and the two bit line bias blocks 711 and 712 are disposed at the middle of the memory MAT. When a plurality of bit line bias blocks are disposed at a plurality of portions of the memory MAT, the bit line precharge time can be more reduced. Reference number 722 denotes a contact point between the power line PL and each of the bias strings BST1 through BST4 and reference numeral 721 denotes a contact point between the common source line CSL and each cell string.

Figure 9:
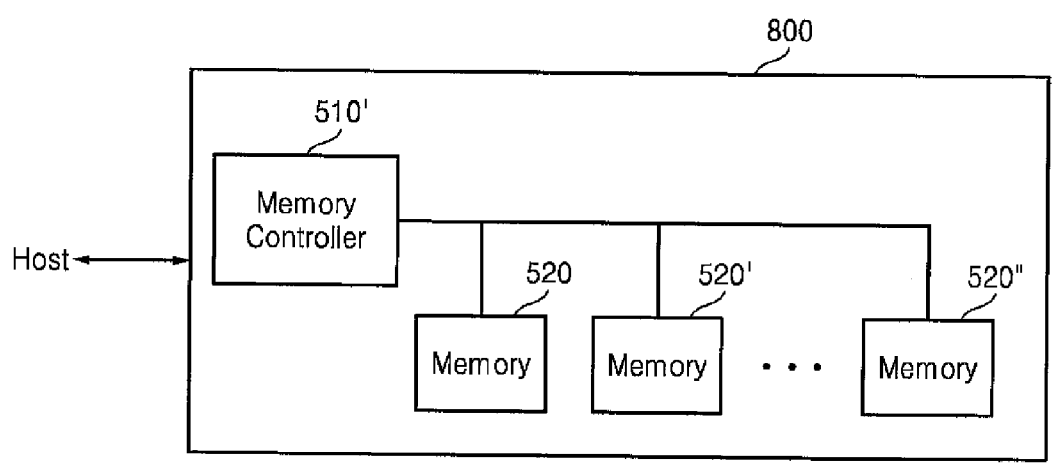
FIG. 9 is a schematic block diagram of a non-volatile memory system according to an embodiment of the inventive concept.

FIG. 9 is a schematic block diagram of a non-volatile memory system 800 according to an embodiment of the inventive concept. The non-volatile memory system 800 comprises a plurality of the non-volatile memory devices 520, 520', and 520" and a memory controller 510 controlling the non-volatile memory devices 520 through 520". One or more of the non-volatile memory devices 520, 520', and 520" may be configured like the non-volatile memory device 10 of FIG. 1. Therefore a detailed description of the non-volatile memory devices 520, 520', and 520" will be omitted.

The non-volatile memory device 520, 520', and 520" and/or the memory controller 510 according to embodiments of the inventive concept may be packaged using various packaging techniques and structures. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The memory device 520, 520', and 520" and the memory controller 510 may be variously configured to form a memory card. Within this type of configuration, the memory controller 510 may be designed to communicate with an external device, e.g., a host, using one of various interface protocols such as universal serial bus (USB), multi-media card (MMC), a peripheral component interconnect express (PCI-E), serial ATA (SATA), parallel ATA (PATA), small computer system interface (SCSI), enhanced small disk interface (ESDI), and integrated drive electronics (IDE).

With the increase of use of mobile devices such as cellular phones, personal digital assistant (PDA) digital cameras, portable game consoles, and MP3 players, the memory devices 10, 520, 520', and 520" can be used as code storages as well as data storages. The memory devices 10, 520, 520', and 520" can also be used in home applications such as high definition televisions (HDTVs), DVDs, routers, and global positioning systems (GPSs).

The non-volatile memory device or the memory system according to an embodiment of the inventive concept may be embedded within an electronic system such as mobile devices, laptop computers, or desktop computers. Some examples of the electronic system are illustrated in FIGS. 10 and 11.

Figure 10:
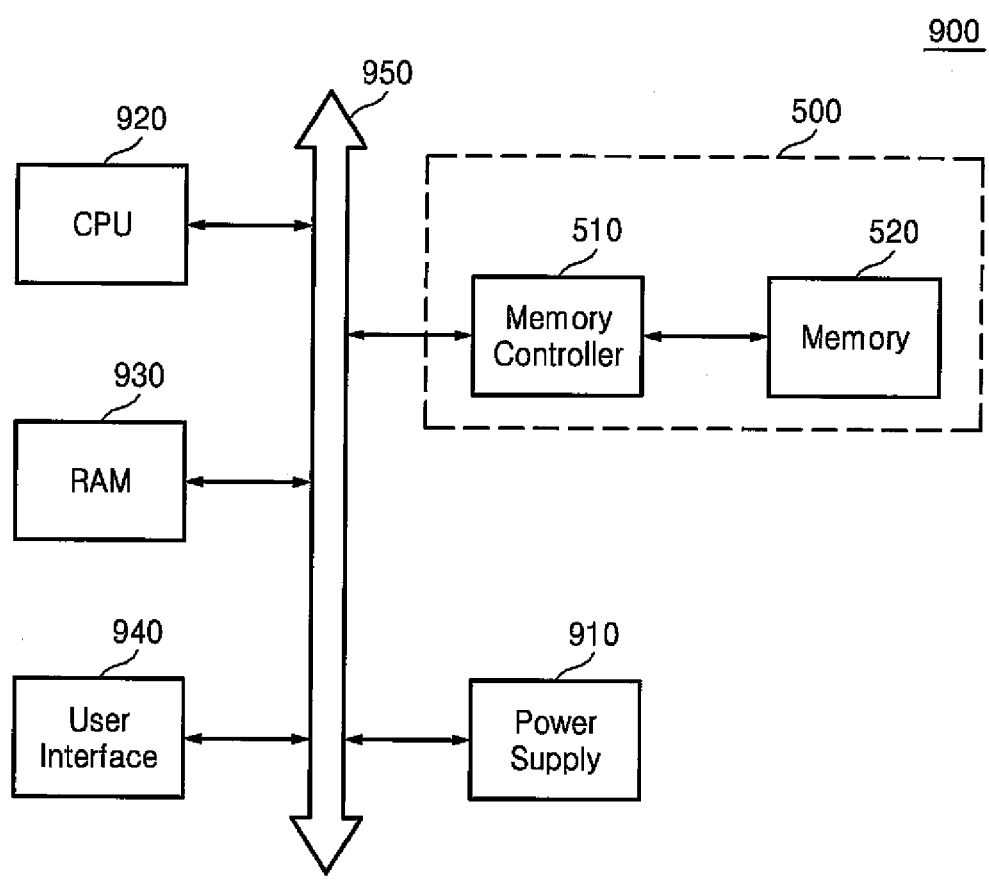
FIG. 10 is a block diagram of an electronic system according to an embodiment of the inventive concept.
Figure 11:
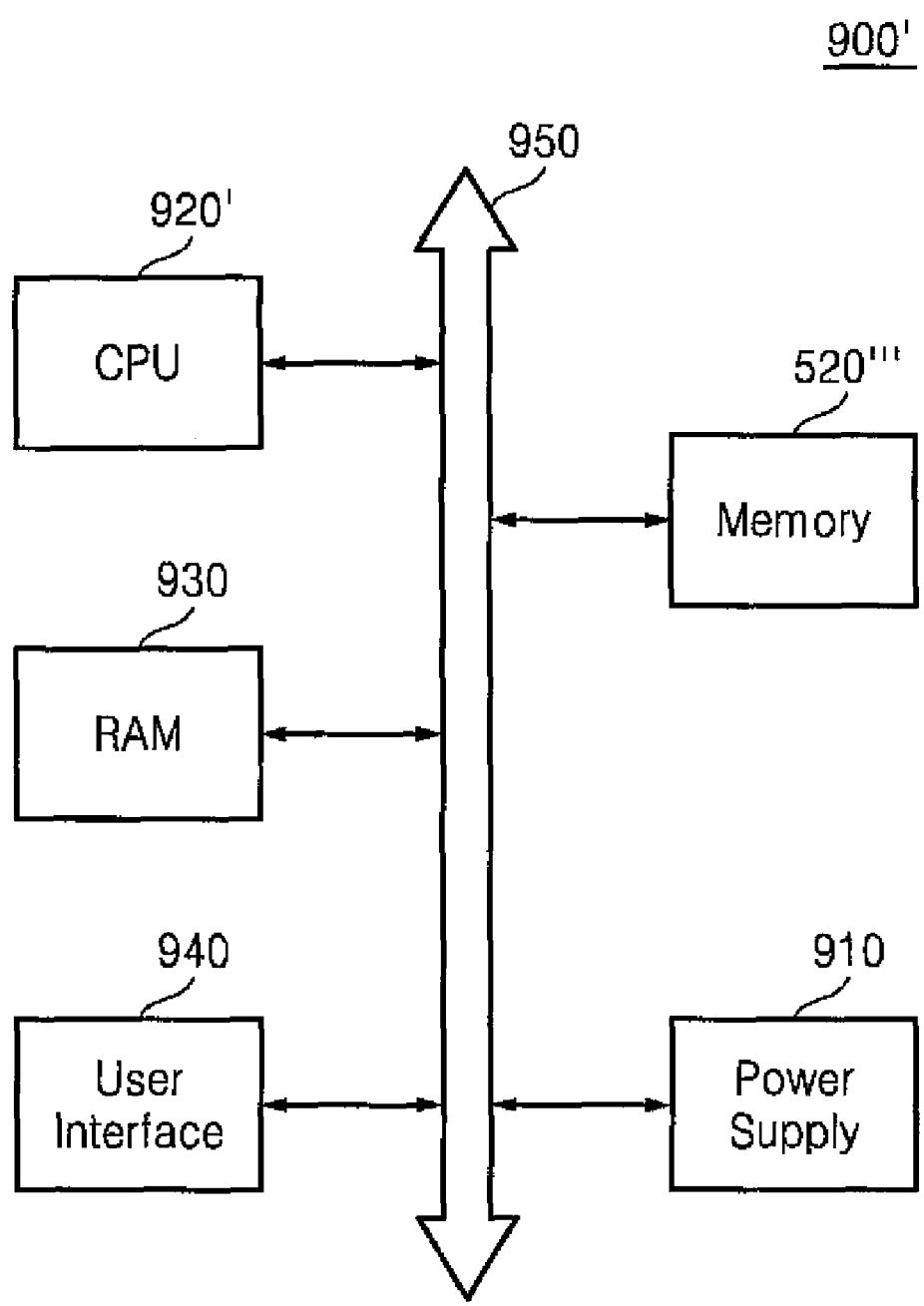
FIG. 11 is a block diagram of an electronic system according to another embodiment of the inventive concept.

Referring to FIG. 10, an electronic system 900 comprises a nonvolatile memory system 500 according to an embodiment of the inventive concept, a power supply 910, a central processing unit (CPU) 920, a RAM 930, a user interface 940, and a system bus 950 electrically connecting these elements.

The CPU 920 controls the overall operation of the electronic system 900. The RAM 930 stores information needed for the operation of the electronic system 900. The user interface 940 provides an interface between the electronic system 900 and a user. The power supply 910 supplies electric power to the internal constituent elements such as the CPU 920, the RAM 930, the user interface 940, and the nonvolatile memory system 500.

The flash memory 520 stores the N-bit data, where N is 1 or an integer greater than 1, that is provided through the user interface 940 or processed or will be processed by the CPU 920, via the memory controller 510.

The memory system 500 according to an embodiment of the inventive concept is as described above. Therefore, a detailed description thereof will be thus omitted.

Although the memory device 520 and the memory controller 510 may together constitute a single memory card, the memory device 520 and the memory controller 510 may be separately embodied. The memory controller and the flash memory may constitute, for example, a solid state drive/disk (SSD) using a non-volatile memory for storing data. The memory controller 510 may be embodied in a host.

FIG. 11 illustrates another electronic system 900' comprising a nonvolatile memory device 520''' functioning as a main memory for the electronic system 900' and configured according to an embodiment of the inventive concept. The CPU 920' controls the overall operation of the electronic system 900' and functions as memory controller. For example, the CPU 920' may receive and process data input via the user interface 940 and then transmit the data to the nonvolatile memory device 520''' via the system bus 950. The nonvolatile memory device 520''' may store the data input via the system bus 950 into memory cells. The data stored in memory cells are read by the CPU 920' and output via the user interface 940.

Although the nonvolatile memory device 520''' has similar construction and function as the nonvolatile memory device 10 illustrated in FIG. 1, the nonvolatile memory device 520''' does not interface with the host via a memory controller but directly interfaces with the host. The electronic system 900' illustrated in FIG. 11 may be portable electronic system such as mobile device.

Although it is not illustrated in the drawings, the electronic system 900 or 900' may be further provided with application chipsets, camera image processors (CISs), or mobile DRAMs, which is well known to one skilled in the art to which the present inventive concept pertains.

The non-volatile memory operation method according to an embodiment of the inventive concept can also be embodied in hardware, software, firmware or combination thereof. When the method is embodied in software, it can be embodied as computer readable codes or programs on a computer readable recording medium. The computer readable recording medium is any data storage device that can store data which can be thereafter read by a computer system. Examples of the computer readable recording medium may includes read-only memory (ROM), random-access memory (RAM), electrically erasable programmable ROM (EEPROM), and flash memory.

As described above, according to an embodiment of the inventive concept, a bit line bias block capable of biasing a bit line is provided such that the bit line may be simultaneously biased from both of the bit line bias block and a page buffer, thereby reducing a bit line bias time.

While the inventive concept has been particularly shown and described with reference to embodiments thereof, it will be understood by those of ordinary skill in the art that various changes in forms and details may be made therein without departing from the scope of the inventive concept as defined by the following claims.

What is claimed is:

1. A non-volatile memory device comprising:
   a memory cell array comprising a plurality of memory blocks, each memory block comprising a plurality of memory cells, and at least one bit line bias block connected to a plurality of bit lines and configured to precharge the plurality of bit lines, wherein
   each of the memory blocks comprises a plurality of cell strings each connected to a corresponding one of the plurality of bit lines,
   the at least one bit line bias block comprises a plurality of bias strings each connected to a corresponding one of the plurality of bit lines, and
   each one of the plurality of bias strings has the same structure as each one of the plurality of cell strings, and the plurality of bias strings is controlled to precharge the plurality of bit lines different from the plurality of cell strings;
   a page buffer configured to precharge the plurality of bit lines and sense data stored in at least one memory block via the plurality of bit lines; and
   a controller configured to control the at least one bit line bias block and the page buffer to simultaneously precharge the plurality of bit lines.

2. The non-volatile memory device of claim 1, wherein each of the bias strings comprises:
   a string selection transistor having a gate connected to a string selection line and a drain connected to a corresponding one of the bit lines;
   a ground selection transistor having a gate connected to a ground selection line and a source connected to a power line; and
   a plurality of memory cell transistors connected in series between the string selection transistor and the ground selection transistor,
   wherein a bit line power voltage for precharging the corresponding bit line is applied via a power line, and
   a precharge control voltage controlling the application of the bit line power voltage to the corresponding bit line is applied to the string selection line, the ground selection line, and gates of the respective memory cell transistors.

3. The non-volatile memory device of claim 1, wherein each of the cell strings comprises:
   a string selection transistor having a gate connected to a string selection line and a drain connected to a corresponding one of the bit lines;
   a ground selection transistor having a gate connected to a ground selection line and a source connected to a common source line; and
   a plurality of memory cell transistors connected in series between the string selection transistor and the ground selection transistor,
   wherein the controller applies a bit line power voltage for precharging a corresponding one of the plurality of bit lines to the common source line of at least one of the memory blocks and controls a precharge control voltage for transmitting the bit line power voltage to the corresponding bit line to be applied to the string selection line, the ground selection line, and gates of the respective memory cell transistors, thereby replacing the at least one memory block with the at least one bit line bias block.

4. The non-volatile memory device of claim 1, wherein the page buffer is disposed at a bottom of the memory cell array and the at least one bit line bias block is disposed at a top of the memory cell array.

5. A non-volatile memory device comprising:
   a memory cell array comprising a plurality of memory blocks, each memory block comprising a plurality of memory cells, and at least one bit line bias block connected to a plurality of bit lines and configured to precharge the plurality of bit lines;

a page buffer configured to precharge the plurality of bit lines and sense data stored in at least one memory block via the plurality of bit lines; and a controller configured to control the at least one bit line bias block and the page buffer to simultaneously precharge the plurality of bit lines, wherein the page buffer is disposed at a bottom of the memory cell array and the at least one bit line bias block is disposed at a middle of the memory cell array.

6. The non-volatile memory device of claim 1, wherein the at least one bit line bias block comprises at least one bias transistor controlled by a bit line precharge control signal and having one terminal connected to a power line and another terminal connected to a corresponding one of the plurality of bit lines.

7. The non-volatile memory device of claim 1, wherein the at least one bit line bias block comprises:
 a plurality of power lines disposed orthogonal to the plurality of bit lines;
 a bias transistor disposed between adjacent ones of the plurality of power lines;
 a first contact configured to connect one terminal of the bias transistor to one of the plurality of power lines; and
 a second contact configured to connect another terminal of the bias transistor to a corresponding one of the plurality of bit lines.

8. The non-volatile memory device of claim 7, wherein each of the memory blocks comprises:
 a string selection line, a ground selection line, and a common source line disposed orthogonal to the plurality of bit lines;
 a string selection transistor having a gate connected to the string selection line and a drain connected to the corresponding one of the plurality of bit lines;
 a ground selection transistor having a gate connected to the ground selection line and a source connected to the common source line; and
 a plurality of memory cell transistors connected in series between the string selection transistor and the ground selection transistor;
 a third contact configured to connect the drain of the string selection transistor to the corresponding bit line; and
 a fourth contact configured to connect the source of the ground selection transistor to the common source line,
 wherein the power lines and the common source line have the same layout,
 the bias transistor has the same layout as the string selection transistor or the ground selection transistor, and
 the first and second contacts have the same layout as the third and fourth contacts.

9. A memory system comprising:
 a memory controller configured connected to at least one non-volatile memory device via a bus,
 wherein the non-volatile memory device comprises:
  a memory cell array comprising a plurality of memory blocks, each memory block comprising a plurality of memory cells, and at least one bit line bias block connected to a plurality of bit lines and configured to precharge the plurality of bit lines, wherein
   each of the memory blocks comprises a plurality of cell strings each connected to a corresponding one of the plurality of bit lines,
   the at least one bit line bias block comprises a plurality of bias strings each connected to a corresponding one of the plurality of bit lines, and
   each one of the plurality of bias strings has the same structure as each one of the plurality of cell strings, and the plurality of bias strings is controlled to precharge the plurality of bit lines different from the plurality of cell strings;
  a page buffer configured to precharge the plurality of bit lines and sense data stored in at least one memory block via the plurality of bit lines; and
  a controller configured to control the at least one bit line bias block and the page buffer to simultaneously precharge the plurality of bit lines.

10. The memory system of claim 9, wherein the at least one non-volatile memory device comprises a plurality of nonvolatile memory devices connected to the memory controller via the bus.

11. The memory system of claim 10, wherein the plurality of nonvolatile memory devices and the memory controller are configured as a memory card.

* * * * *